United States Patent
Steigemann et al.

(10) Patent No.: US 11,175,404 B2
(45) Date of Patent: Nov. 16, 2021

(54) LIDAR SYSTEM AND METHOD OF OPERATING THE LIDAR SYSTEM COMPRISING A GATING CIRCUIT RANGE-GATES A RECEIVER BASED ON A RANGE-GATING WAVEFORM

(71) Applicant: NXP B.V., Eindhoven (NL)

(72) Inventors: Mark Steigemann, Ebstorf (DE); Maxim Kulesh, Hamburg (DE)

(73) Assignee: NXP B.V., Eindhoven (NL)

( * ) Notice: Subject to any disclaimer, the term of this patent is extended or adjusted under 35 U.S.C. 154(b) by 561 days.

(21) Appl. No.: 16/207,036

(22) Filed: Nov. 30, 2018

(65) Prior Publication Data

US 2020/0174120 A1 Jun. 4, 2020

(51) Int. Cl.
| | |
|---|---|
| *G01S 17/18* | (2020.01) |
| *G01S 17/08* | (2006.01) |
| *H01L 27/146* | (2006.01) |
| *H01L 31/02* | (2006.01) |

(52) U.S. Cl.
CPC ........ *G01S 17/08* (2013.01); *H01L 27/14643* (2013.01); *H01L 31/02027* (2013.01); *G06T 2207/10028* (2013.01)

(58) Field of Classification Search
CPC ........ G01S 17/08; G01S 17/18; G01S 17/894; G01S 7/4863; G01S 7/4865; G06T 2207/10028; H01L 27/14643; H01L 31/02017
USPC .............................................. 250/221, 214 R
See application file for complete search history.

(56) References Cited

U.S. PATENT DOCUMENTS

| | | | |
|---|---|---|---|
| 7,462,808 B2 * | 12/2008 | Lustenberger | G01S 17/894 250/208.1 |
| 9,516,244 B2 | 12/2016 | Borowski | |
| 9,625,580 B2 | 4/2017 | Kotelnikov et al. | |
| 2017/0052065 A1 | 2/2017 | Sharma et al. | |

OTHER PUBLICATIONS

Kostamovaara, Juha et al.; "On Laser Ranging Based on High-Speed/Energy Laser Diode Pulses and Single-Photon Detection Techniques", vol. 7, No. 2, IEEE Photonics Journal, Apr. 2015; 16 pgs.

* cited by examiner

*Primary Examiner* — Que Tan Le

(57) ABSTRACT

Embodiments of a system and method are disclosed. In an embodiment, a LiDAR (Light Detection and Ranging) system that can include a sensor circuit comprising a controller unit, a transmitter, a gating circuit, and a receiver element, wherein the gating circuit is connected to the controller unit and to the receiver element, wherein signals detected by the sensor circuit correspond to at least one physical object located in an operating region with respect to a location of the sensor circuit and based on multiple measurements. The gating circuit can range-gate the receiver element based on a range-gating waveform, and the controller unit can provide a phase-delay parameter for phase shifting the range-gating waveform with different phase values relative to a light signal transmitted by the transmitter for different measurements by the sensor circuit.

20 Claims, 12 Drawing Sheets

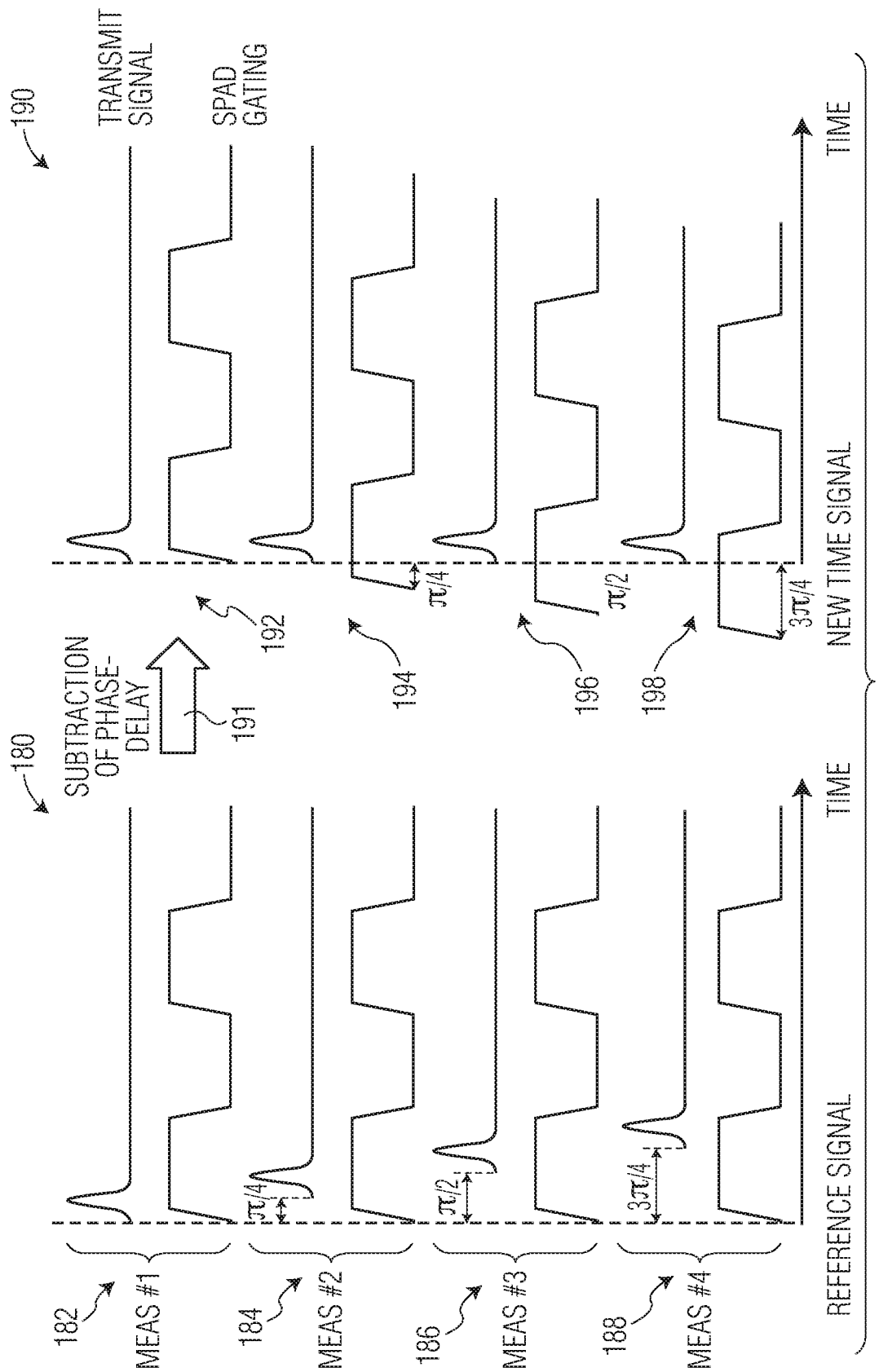

LIDAR SYSTEM AND METHOD OF OPERATING THE LIDAR SYSTEM COMPRISING A GATING CIRCUIT RANGE-GATES A RECEIVER BASED ON A RANGE-GATING WAVEFORM

BACKGROUND

Sensor systems that utilize LiDAR (Light Detection and Ranging) are increasingly being deployed in vehicles to implement, for example, safety and/or autonomous driving features. A typical LiDAR system includes a light source and a detector. The light source can be, for example, a laser that emits light having a particular operating wavelength. The light source emits light toward a target, which then scatters the light. Some of the scattered light is received back at the detector. The system determines the distance to the target based on one or more characteristics associated with the returned light. For example, the system may determine the distance to the target based on the time-of-flight of a returned light pulse.

LiDAR plays an important role in autonomous vehicles due to its high range and angular resolutions. SPAD (Single-Photon Avalanche Photodiode), also sometimes referred to as Geiger-Mode Avalanche Photodiode, is one of the promising receiver technologies for automotive LiDAR thanks to its unique properties including a high sensitivity down to a single photon, a high time resolution, and a low cost and high array resolution enabled by planar device structures (e.g. CMOS SPAD). By biasing a device above a breakdown voltage, even a single released charge carrier (e.g., an electron or "hole") can result in a self-sustained avalanche. A release of charge carrier can be due to the absorption of the photon (e.g., signal or noise), which may be thermally generated (known as a "dark count"), or the release of trapped charge carriers from a previous avalanche (known as "afterpulses"). Note that avalanche triggers can be considered herein as an event. Upon an event, the SPAD device can be quenched-off (e.g., the bias voltage can be lowered below the breakdown voltage into a linear operation mode), to avoid permanent damage of the device.

SPAD has a proven record of time-of-flight in time correlated single photon counting (TCSPC) configurations for short range and low noise environment applications, such as fluorescence lifetime microscopy. In such a configuration, a SPAD array may include a timing circuit composed of, for example, a Time-to-Digital Converter (TDC), or a Time-to-Analog Converter (TAC) followed by an Analog-to-Digital Converter (ADC), which together measure the time between the reference signal (e.g. laser light pulse) and the SPAD output signal caused by an avalanche. The corresponding time-of-flight record can be stored, for example, in a register or a latch for subsequent read-out. In such configurations, the earlier photons "block" the following photons, and the probability that the time-of-flight is not yet recorded and that the SPAD is active can drop exponentially with the time.

In order to mitigate the effect of single-photon operation mode (e.g., blocking of signal by prior noise, non-unity photon detection probability, etc.) a single acquisition cycle can be composed of multiple measurements and a signal can be identified via a statistical approach, such as, for example, by a construction of time-of-flight records histogram and further signal processing.

For a long range and high noise outdoor environment such as automotive applications, a simple statistical approach is insufficient. Adapting TCSPC for such an application requires a multitude of improvements, including, but not limited to, adding an optical bandpass filter, limiting the field-of-view (which together can reduce the amount of noise photons hitting the device), and implementing comprehensive range-gating techniques. Range-gating is a technique that can be utilized to ensure that the SPAD is active for a sub-region within complete operational region, thereby avoiding "blocking" by prior noise outside of the sub-region. Note that such a sub-region can be referred to as a gating window. In the case of multiple gating windows within a single measurement cycle, a certain dead-time, wherein the SPAD is inactive (e.g., in a linear mode), must be preserved, to substantially reduce the probability of an afterpulse (e.g. low to mid-single digit percentage probability), and for readout of a time-of-flight record, which can limit the maximum number of gating windows.

Short gating windows may require many measurements to cover a complete operational range, and can result in a substantial increase in the total number of measurements that may be required to obtain sufficient time-of-flight records for a signal detection. Consequently, a trade-off between the update rate and the signal-to-noise ratio may be necessary. In contrast, long gating windows can suffer from the noise-blocking effects described earlier. Therefore, conventional gating schemes involve gating windows with a width equal to a dead-time, as this can allow for coverage of a complete operational range in two measurements by swapping active and inactive windows for subsequent measurements.

In daylight, such a gating window width, however, can still result in substantial blocking and unwanted effects such as background clutter-edges (e.g., an abrupt change in noise level that can be falsely identified as signal) at the windows boundaries and non-uniform relative to range sensitivity. The sensitivity in signal detection determines the ability of the system to distinguish a signal from background noise. A higher sensitivity can result in a higher signal detection rate and/or a lower false detection/alarm rate.

SUMMARY

Embodiments of a system and a method are disclosed. In an embodiment, a LiDAR (Light Detection and Ranging) system is disclosed. The LiDAR system can include a sensor circuit comprising a controller unit, a transmitter, a gating circuit, and a receiver element, wherein the gating circuit is connected to the controller unit and to the receiver element, wherein signals detected by the sensor circuit correspond to at least one physical object located in an operating region with respect to a location of the sensor circuit and based on multiple measurements. In addition, the gating circuit can range-gate the receiver element based on a range-gating waveform, and the controller unit provides a phase-delay parameter for phase shifting the range-gating waveform with different phase values relative to a light signal transmitted by the transmitter for different measurements by the sensor circuit.

In an embodiment of the LiDAR system, the phase shifting of the range-gating waveform can be effectuated by transmitting from the transmitter the light signal with a time delay of a reference signal-to-transmitter path that is equivalent to a desired phase shift and a recovery of an actual time-of-flight by subtracting the time delay from a time-of-flight record as measured by a timing circuit of the sensor circuit.

In an embodiment of the LiDAR system, the timing circuit can include a time-to-digital converter array.

In an embodiment of the LiDAR system, the gating circuit can facilitate interleaving of the range-gating waveform via a subsequent subtraction of a phase-delay parameter for the recovery of the actual time-of-flight.

In an embodiment of the LiDAR system, the gating circuit can facilitate interleaving of the range-gating waveform via a phase-delay parameter comprising a pseudo-random phase delay with a subsequent subtraction of a phase-delay parameter for the recovery of the actual time-of-flight.

In an embodiment of the LiDAR system, the gating circuit can facilitate interleaving of the range-gating waveform via a phase-delay parameter comprising a random phase delay with a subsequent subtraction of a phase-delay parameter for the recovery of the actual time-of-flight recovery.

In an embodiment of the LiDAR system, a level of the background noise can be measured by the sensor circuit, and a phase-shift resolution can be adapted for the phase shifting, wherein the phase-shift resolution comprises a minimum difference between two different phase-shift values, with respect to the level of the background noise level.

In an embodiment of the LiDAR system, the receive element can include a SPAD (Single-Photon Avalanche Photodiode) array.

In another embodiment, a LiDAR system is disclosed. The LiDAR system can include a sensor circuit comprising a controller unit, a transmitter, a gating circuit, a timing circuit and a receiver element, wherein the gating circuit is connected to the controller unit and to the receiver element and the receiver element is connected to the timing circuit, wherein signals detected by the sensor circuit correspond to at least one physical object located in an operating region with respect to a location of the sensor circuit and based on multiple measurements. The gating circuit can range-gate the receiver element based on a range-gating waveform, and the controller unit can provide a phase-delay parameter for phase shifting the range-gating waveform with different phase values relative to a light signal transmitted by the transmitter for different measurements by the sensor circuit.

In an embodiment of the LiDAR system, the timing circuit can include a time-to-digital converter array and the receiver element can include a SPAD (Single-Photon Avalanche Photodiode) array.

In an embodiment of the LiDAR system, the phase shifting of the range-gating waveform can be effectuated by transmitting from the transmitter the light signal with a time delay of a reference signal-to-transmitter path that is equivalent to a desired phase shift and a recovery of an actual time-of-flight by subtracting the time delay from a time-of-flight record as measured by the timing circuit.

In an embodiment of the LiDAR system, the gating circuit can facilitate interleaving of the range-gating waveform via a phase-delay parameter comprising a random phase delay with a subsequent subtraction of a phase-delay parameter for the recovery of the actual time-of-flight recovery.

In another embodiment, a method of operating a LiDAR (Light Detection and Ranging) system, is disclosed. The method can involve identifying, based on multiple measures, detected signals corresponding to at least one physical object located in an operating region with respect to a location of a LiDAR system that includes a receiver element. The method can further involve range-gating the receiver element of the LiDAR system based on a range-gating waveform, and phase shifting the range-gating waveform with different phase values relative to a light signal transmitted by the LiDAR system for different measurements by the LiDAR system.

The method can further involve effectuating the phase shifting of the range-gating waveform by transmitting from the LiDAR system the light signal with a time delay of a reference signal-to-transmitter path that is equivalent to a desired phase shift and a recovery of a time-of-flight by subtracting the time delay from a time-of-flight record as measured by a timing circuit of the LiDAR system.

In an embodiment of the method, the timing circuit can include a time-to-digital converter array.

An embodiment of the method can further involve facilitating interleaving of the range-gating waveform via a subsequent subtraction of a phase-delay parameter for the recovery of the time-of-flight.

An embodiment of the method can further involve facilitating interleaving of the range-gating via a phase-delay parameter comprising a pseudo-random phase delay with a subsequent subtraction of a phase-delay parameter for the recovery of the time-of-flight.

An embodiment of the method can further involve facilitating interleaving of the range-gating waveform via a phase-delay parameter comprising a random phase delay with a subsequent subtraction of a phase-delay parameter for the recovery of the time-of-flight.

An embodiment of the method can further involve measuring a level of the background noise, and adapting a phase-shift resolution for the phase shifting, wherein the phase-shift resolution comprises a minimum difference between two different phase-shift values, with respect to the level of the background noise level.

In an embodiment of the method, the receiver element can include a SPAD array.

BRIEF DESCRIPTION OF THE DRAWINGS

FIG. 7 depicts a diagram illustrating gating phase-shifting achieved via phase-delaying of a transmit signal and a subsequent subtraction of a phase-delay value from a time-of-flight record.

DETAILED DESCRIPTION

Figure 1:
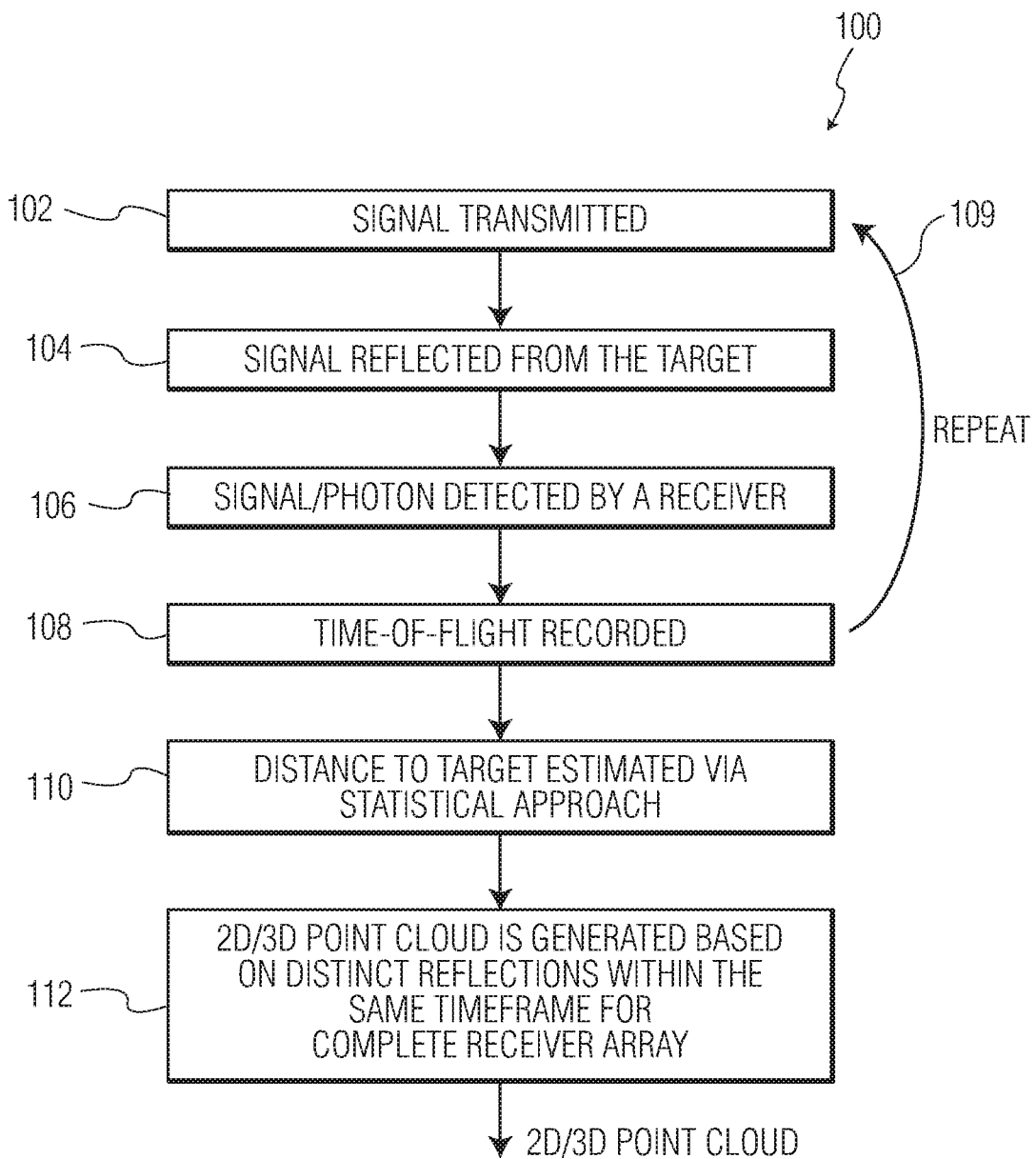
FIG. 1 depicts a signal flow diagram of a method of operating a LiDAR system based on a statistical approach.

It can be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art can recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Several aspects of the disclosed embodiments are presented with reference to various systems, methods and devices. These systems, methods and devices are described in the following detailed description and illustrated in the accompanying drawings by various blocks, modules, components, circuits, steps, operations, processes, algorithms, engines, applications, etc. (which can be individually or collectively referred to as an "element" or "elements"). These elements may be implemented using electronic hardware, computer software, or any combination thereof. Whether such elements are implemented as hardware or software depends upon the particular application and design constraints imposed on the overall system.

The following descriptions and figures are based on embodiments involving a direct time-of-flight ranging technique. It can be appreciated by those skilled in the art, however, in light of the description herein, that the disclosed embodiments can be practiced in the context of other ranging techniques, such as, for example, indirect time-of-flight based on phase-shift or frequency-shift (FMCW). Note that the term time-of-flight as utilized here can relate to a property of an object, particle or acoustic, electromagnetic or other wave. The time of-flight is the time that such an object needs to travel a distance through a medium. The time-of-flight can further relate to methods for measuring the distance between a sensor (e.g., a LiDAR system) and an object, based on the time difference between the emission of a signal and its return to the sensor, after being reflected by an object.

FIG. 1 depicts a signal flow diagram of a method 100 of operating a LiDAR system based on a statistical approach. As shown at block 102, a laser light signal can be transmitted. Thereafter, as depicted at block 104, the signal can be reflected from the target lying in the path of the transmitted laser light signal. Then, upon detection of the reflected light as indicated at block 106, the time-of-flight can be recorded in a time-of-flight record, as illustrated at block 108. Measurements can be repeated multiple times as indicated by arrow 109 and a statistical approach can be used to identify the actual time-of-flight and as a result, the range to the target, as depicted at block 110. That is, the distance to the target can be estimated via a statistical approach, as indicated at block 110.

Combining distinct target reflections within a single timeframe from a complete receiver array, a step or operation can be implemented as shown thereafter at block 112 in which a 2D/3D point cloud of the environment can be generated. Processing of a LiDAR system may extend beyond 2D/3D point cloud generation and can include further filtering of the point cloud (e.g., Kalman filter), segmentation, objects classification and state estimation, as shown in the alternative embodiment depicted in FIG. 2.

Note that as utilized herein the term point cloud can relate to a set of data points in space. A point cloud can be used to measure a large number of points on surfaces and of objects around such surfaces. A point cloud can also relate to an organized point-cloud map obtained by indexing 3D (Three-Dimensional) data to LiDAR-specific 2D (Two-Dimensional) coordinate system or vice-versa.

Figure 2:
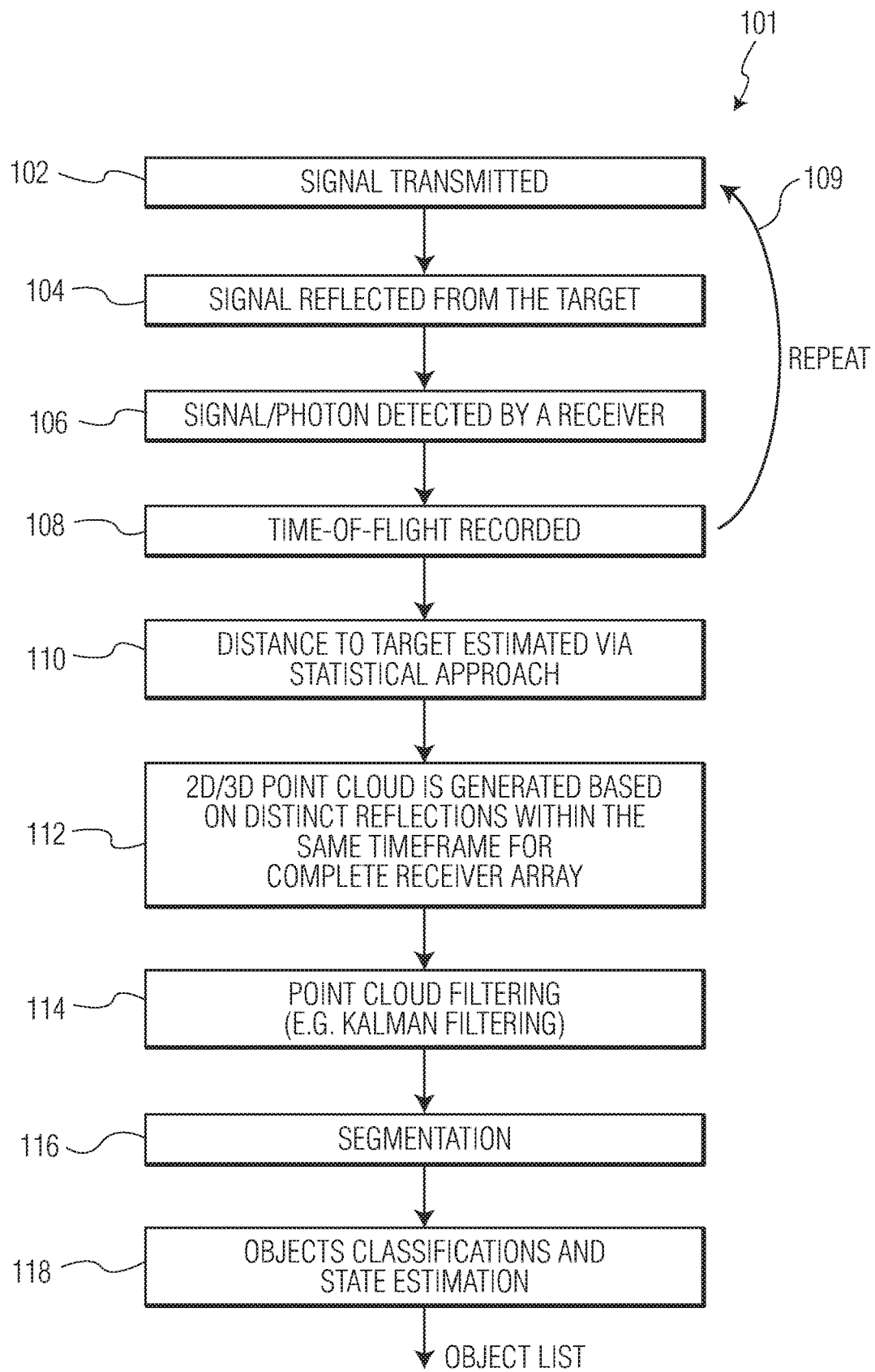
FIG. 2 depicts a signal flow diagram of a method of operating a LiDAR system based on a statistical approach with advanced post-point cloud processing.

FIG. 2 depicts a signal flow diagram of a method 101 of operating a LiDAR system based on a statistical approach with advanced post-point cloud processing. Note that in FIGS. 1-2, identical steps, operations, components or elements are indicated by identical reference numerals. The method 101 shown in FIG. 2 is thus an alternative version of the embodiment shown in FIG. 1, and includes additional steps or operations. For example, following the operation depicted at block 112, a point cloud filtering operation (e.g., Kalman filtering) can be implemented, followed by a segmentation step or operation, as shown at block 116. Then, a step or operation can be implemented for object classification and state estimation, as shown at block 118.

Note that the term segmentation as utilized herein can relate to segment-based classification, which is a classification technique that can be utilized to classify data based on segments (e.g., such as image segments in an image). The term state estimation can relate to tools or applications for determining the present, past or future operation state of a system. The term object classification can relate to the identification and classification of objects based on previously defined classes or types. Object classification can also relate to classifying objects based on object-level features.

Figure 3:
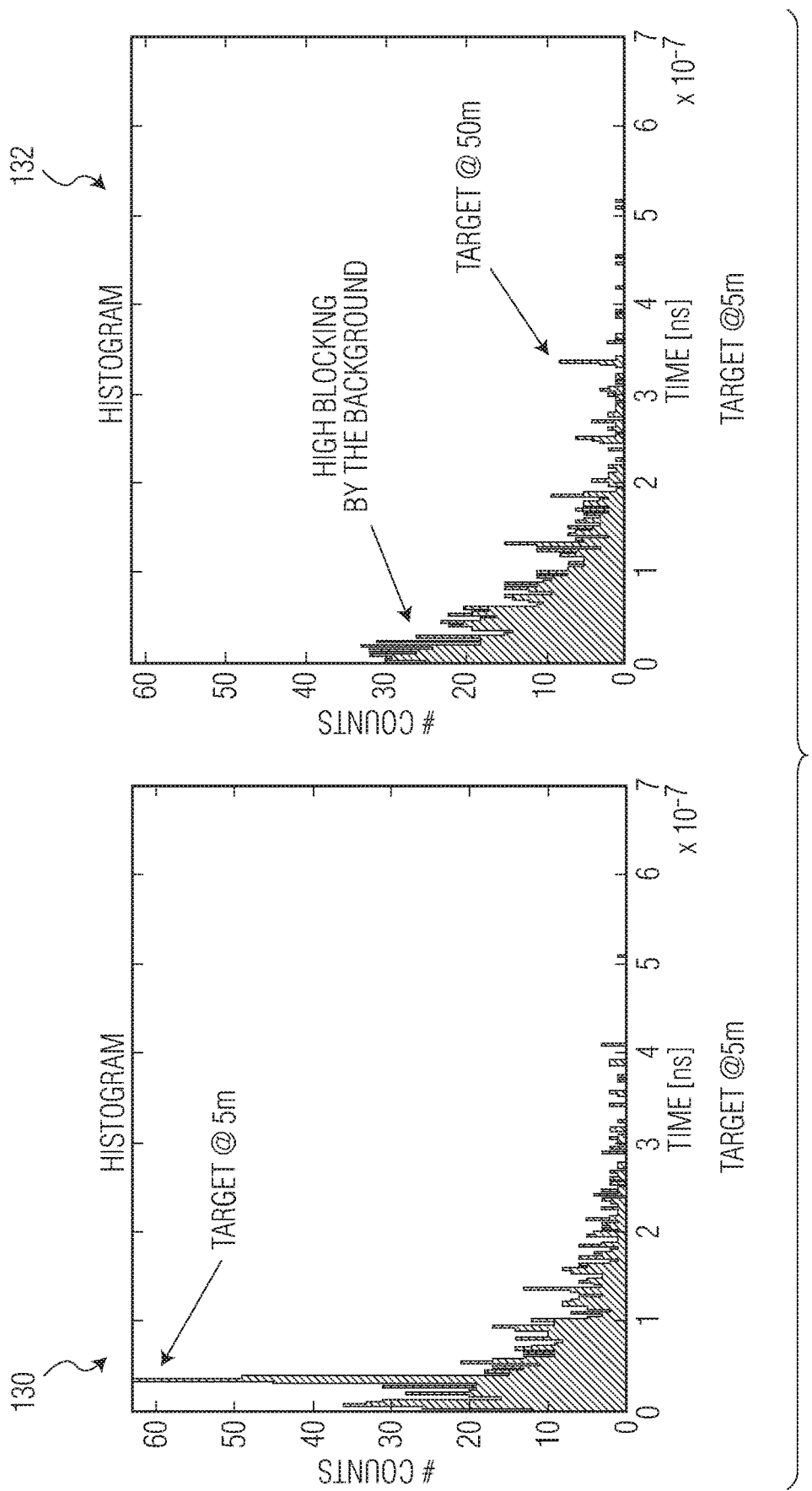
FIG. 3 depicts example time-of-flight histograms for targets at 5 and 50 meters respectively with no range-gating implemented.

As discussed in the background section of this disclosure, a range-gating technique may be needed to deal with a high-noise outdoor environment while satisfying high range requirements. FIG. 3 therefore depicts example time-of-flight histograms 130 and 132 for targets at 5 and 50 meters respectively with no range-gating implemented. High blocking by noise, such as detections caused by sunlight or thermally induced events, can be observed in the histograms, resulting in an effectively reduced maximum operating range of the system. Note that as utilized herein, the term histogram can relate to representations of the distribution of numerical data and in particular to LiDAR histograms utilized in laser detection applications such as LiDAR.

Figure 4:
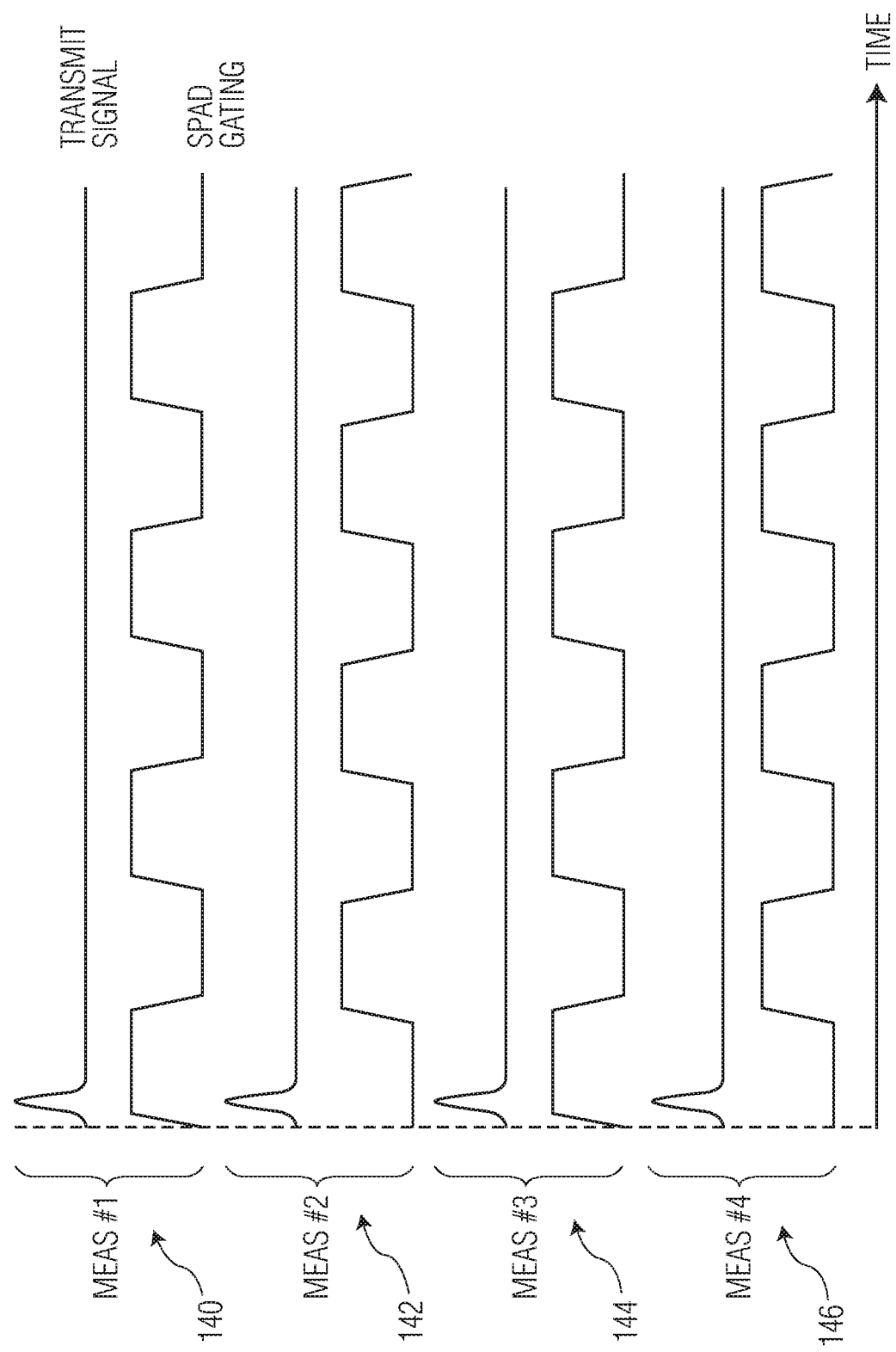
FIG. 4 depicts waveform diagrams illustrating square wave range-gating with complement waveforms for subsequent measurements.

FIG. 4 depicts waveform diagrams 140, 142, 144, and 146 illustrating square wave range-gating with a complement waveform for subsequent measurements. In square wave range-gating with complement gating waveform for subsequent measurements as depicted in FIG. 4, the window width can be limited by the dead-time necessary for SPAD recovery and the reduction of after-pulse probability, given that time-of-flight records may be read-out after each gating window.

The term waveform as utilized herein can relate to a graphical representation of a signal in the form of a wave. A waveform can be sinusoidal as well as square shaped, depending on the type of wave input. The waveform depends on the properties that define the size and shape of the wave.

The term complement as utilized herein can relate to complementary waveforms, which are waveforms that are similar to other waveforms but subject to a delay by some particular parameter, such as, for example, 90 degrees, etc. In other words, one waveform may be a complement of another waveform by some particular parameter or value.

Figure 5:
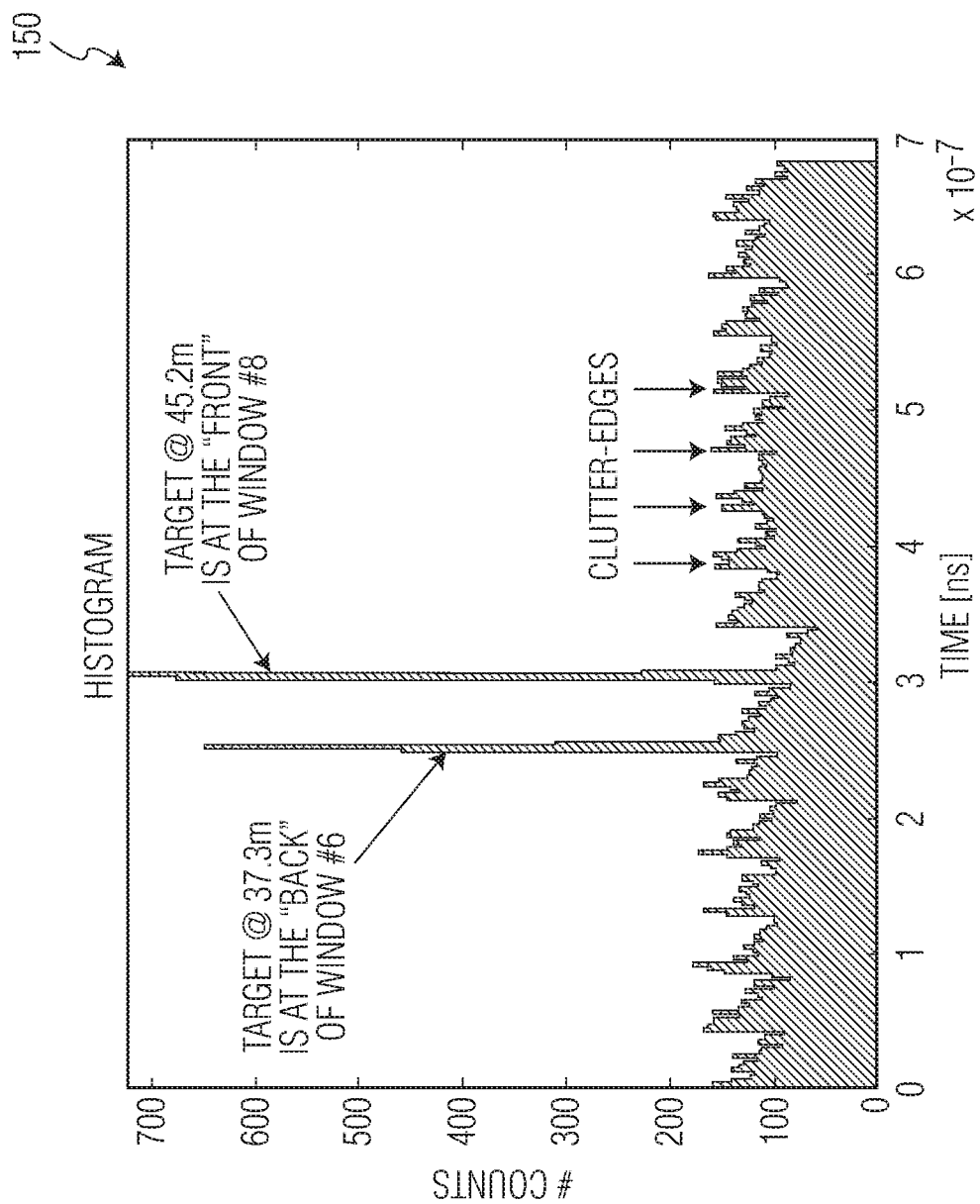
FIG. 5 depicts a time-of-flight histogram with example targets located at 37.3 and 45.2 meters with a range-gating width of ~42 ns.

FIG. 5 depicts an example time-of-flight histogram 150 with targets located at, for example, 37.3 and 45.2 meters with a range-gating width of ~42 ns with pronounced clutter-edges. It can further be observed that closer target at 37.3 meters has a lower peak than further target at 45.2 meters. This can be explained by the fact that the target at, for example, 37.3 meters is "at the back" of Window #6, while the target at, for example, 45.2 meters is located closer to the front of Window #8. This indicates non-uniform relative to the range system sensitivity.

The disclosed range-gating technique can be based on a phase-shifting gating waveform to achieve or effectuate gating interleaving. As a result, a single target may be located at different places within a single or potentially multiple gating windows across different measurements. The disclosed embodiments can thus create an effect similar to that of gating window widths smaller than the actual width.

This approach can provide a substantially reduced background noise clutter-edge effect, uniform sensitivity, and as a result can extend the maximum sensing range of a LiDAR system. Note that as utilized herein, the term "uniform" in the context of "uniform sensitivity" can relate to the a sensitivity that does not change in form or character or which remains the same in call cases and at all times or in most cases and times.

In an embodiment, an original gating may be a square wave with a gating window width that can be limited by the dead-time, which may be required for SPAD recovery and after-pulse avoidance (e.g., 40 ns). First, m measurements can be performed with a phase-shift of 0 (i.e. with an original waveform). Subsequent m measurements can be phase-shifted by a value φ. This phase-shifting process can be referred to as a phase resolution, for example, by some factor of π, such as π/q (e.g., for a gate window of 40 ns, a phase-shift of π/4 can correspond to 10 ns).

For each subsequent phase-shift of π/q, m measurements can be performed. After a phase-shift of (2q−1)*π/q, or in total N=2*q*m measurements, the phase can be set back to 0. Important features of the measurements can include reduced clutter edge effects and a more uniform sensitivity. Such features can increase reliable peak detection in higher detection ranges.

Figure 6A:
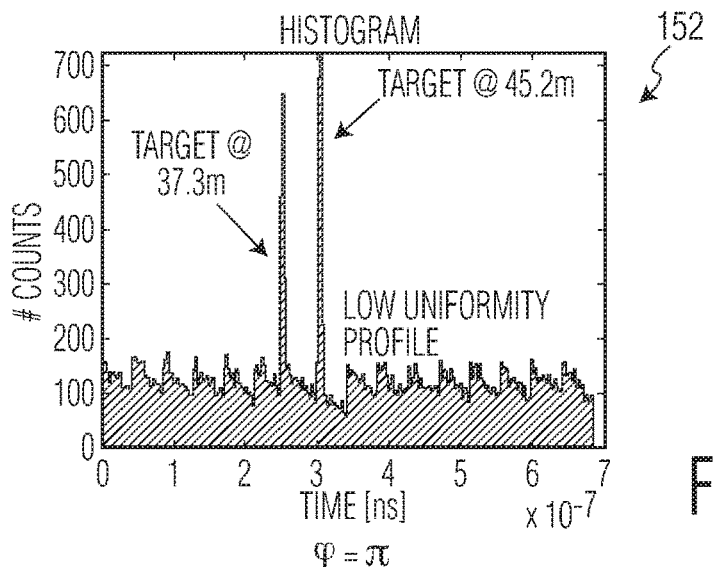
FIGS. 6A, 6B, and 6C depict time-of-flight histograms with implemented interleaved gating across different phase resolutions, $\varphi$.
Figure 6B:
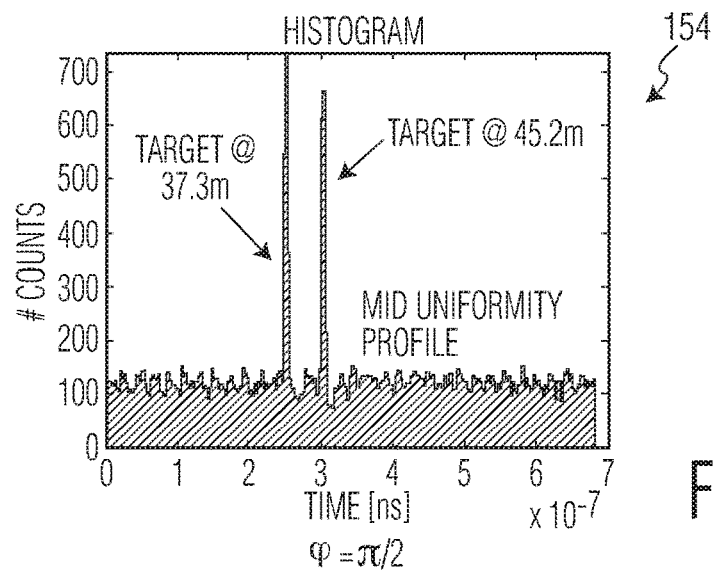
Figure 6C:
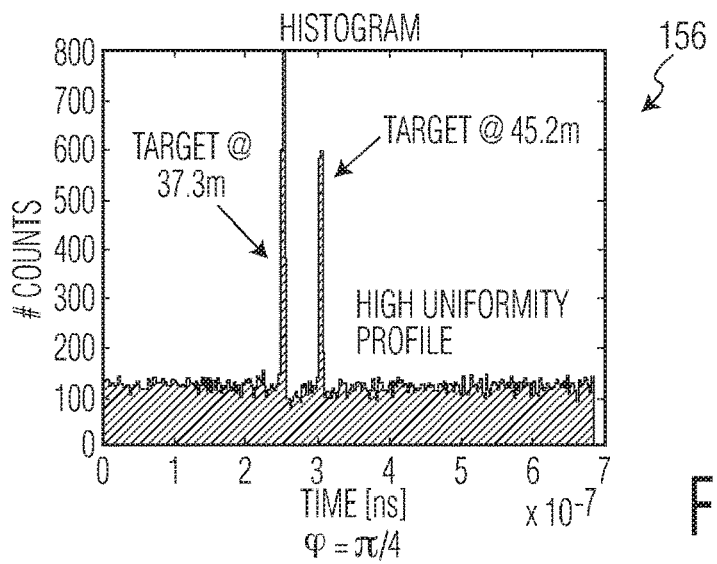

FIGS. 6A, 6B, and 6C depict respective time-of-flight histograms 152, 154, and 156 with implemented interleaved gating for different phase resolutions φ. The case of φ=π can correspond to conventional square wave gating with a complement after N measurements. (Recall that FIG. 4 depicts waveform diagrams 140, 142, 144, and 146 illustrate square wave range-gating with a complement waveform for subsequent measurements). It can be observed from the time-of-flight histograms 152, 154, and 156 that finer phase resolutions φ can result in a more uniform background noise, reduced clutter edges, and a more uniform sensitivity. As a result, more accurate representations of signal reflections can be obtained.

Range-gating of waveforms can result in a higher uniformity of the detection sensitivity relative to the range and reduced clutter-edge as follows. Due to the Poisson nature of background noise, the probability that the time-of-flight is not recorded and that SPAD is active drops exponentially with time as indicated by the following representation:

$$p(t) = \exp(-t/\tau),$$

where τ represents the noise photon detection mean time, and t represents the time. For the sake of simplicity, assume a strong signal such that it always results in a detection by a receiver element (e.g., a SPAD array) if not already blocked by a noise photon. In this case, it can be easily demonstrated that for conventional square waveform gating (e.g., complementary in subsequent measurements), a number of signal detections can be determined as follows:

$$D(t) = \frac{N}{2} \exp(-t \bmod(\Delta)/\tau),$$

where $\Delta$ can represent the gating window width, and N can represent the total number of measurements. In addition, $t \bmod(\Delta)$ can represent a reason for clutter-edges generated by noise, as a function is not differentiable at t multiple of $\Delta$, i.e. at the boundaries of gates. The number of detections for interleaved gating waveforms with a phase-shift of π/q can be found as a sum of geometric series, as follows:

$$D(t) = \frac{N}{2q} \exp(-t \bmod(\Delta/q)/\tau) \frac{(1 - \exp(-\Delta/\tau))}{(1 - \exp(-\Delta/q\tau))},$$

This can coincide with the equation for alternating square waveform, if q is set to 1. One of the goals of the disclosed approach can be to establish uniform sensitivity, i.e. to minimize the difference or the spread between minimum and maximum values of D(t). Obviously, the minimum and maximum values of D(t) can be given by positive and negative limits of multiple of $\Delta/q$, respectively:

$$\delta D(t) = \lim_{t \to \Delta/q^+} D(t) - \lim_{t \to \Delta/q^-} D(t) = \frac{N}{2q}(1 - \exp(-\Delta/\tau)),$$

As can be seen from these formulations, the interleaving of gating waveforms by a factor of $\pi/q$ can also reduce the absolute values of clutter-edge effects and non-uniformity by a factor of q. When normalized relative to the maximum value, the following representation can be obtained:

$$\delta D/D = (1 - \exp(-\Delta/q\tau))$$

wherein by interleaving, the same result can be effectuated as one would obtain by narrowing the actual gating window width. A real narrowing of the actual gating window width can result in more measurements that may be needed for covering a complete operational range, which can result in a trade-off between the update rate and the signal to noise ratio, as discussed earlier herein. Thus, a range-gating waveform can be phase-shifted by different phase values relative to a transmitted light signal for different measurements. Such a range-gating operation can involve the interleaving process described herein, which may result in one or more of the following: a uniform (e.g., consistent) sensitivity, a reduction in background noise (e.g., background noise clutter edges), and an extension of the maximum operational range of the sensor circuitry/system such as the LiDAR systems discussed herein.

In an alternative embodiment, the original gating waveform can be of any other form and may not contradict the essence of the disclosed embodiments. Additionally, phase-shifting can be achieved via phase-delaying of the transmit signal and a subsequent subtraction of a phase-delay value from measured time-of-flight records to recover the actual time-of-flight record, which can result in an equivalent phase-shifting of the gating waveform.

FIG. 7 depicts timing diagrams 180 and 190 illustrating a phase shifting of square wave gating waveforms through the use of a phase-delaying transmit signal and a subsequent subtraction of the delay from a timing circuit output. The subtraction of the phase delay is indicated in FIG. 7 by arrow 191.

SPAD gating waveforms 182, 184, 186 and 188 are shown in diagram 180 located on the left side of FIG. 7. The waveform 182 can indicate a no-phase delay, and the waveform 184 can indicate a phase-delay of pi/4 (i.e., $\pi$/4). The waveform 186 can be based on a phase delay of pi/2 (i.e., $\pi$/2). The waveform 188 can indicate a phase-delay of 3pi/4 (i.e., 3$\pi$/4).

The subtraction of the phase-delay indicated by arrow 191 can lead to the timing diagram 190 shown on right side of FIG. 7. The timing diagram 190 can include a waveform 192 (no phase-shift), a waveform 194 (phase shift of pi/4 (i.e., $\pi$/4)), a waveform 196 (phase shift of pi/2 (i.e., $\pi$/2)), and a waveform 198 (phase shift of 3pi/4 (i.e., 3$\pi$/4)). One of the advantages of the disclosed embodiments is that the phase-delay implementation phases for each measurement can be set pseudo-randomly, under a condition that measurements for all phases available, given phase-shift resolution, can be provided in equal numbers, thereby ensuring uniformity. Such a pseudo-random phase shift may improve a system's resistance to interference from, for example, other LiDAR systems, external noise or even intended LiDAR "spoofing" attacks.

Another advantage of the disclosed embodiments is that for phase-delay implementation, the phases for each measurement can be set randomly, under condition that the underlying distribution is uniform and a sufficient number of measurements are performed to ensure uniformity of the resulting dataset.

A further advantage of the disclosed embodiments is that for phase-delay implementation and recovery of the actual time-of-flight, the phase-shift resolution is flexible and can be adapted to the background noise level, whereas the background noise is measured preferably by the SPAD array itself or alternatively by an auxiliary ambient light sensor.

Note that term "background noise" as utilized herein refers to the noise detection mean time, given as $\tau$ in the equations above, which renders the SPAD receiver a more suitable candidate due to single-photon operation mode.

In addition, by measuring the noise level via the SPAD itself, the internal noise, (e.g., thermal) can also be taken into account. The noise detection mean time $\tau$ can be estimated via a histogram by regularly (e.g. once in a second) running one or few measurement cycles without transmitting a signal (i.e. only observing background internal and external noise detections). Histogram data can be then directly passed to a controller unit (e.g., such as the controller unit 212 show in FIGS. 8, 9, and 10) by the "noise level" link. The necessary phase-shift value to attain a certain uniformity=$\alpha$ (for example 10%) can be found as follows:

$$q = -\frac{\Delta}{\tau \ln(1-a)},$$

where $\Delta$ represents the actual gate-width and is known, and $\tau$ represents the noise detection mean time and is estimated from a histogram. In addition, a logarithm operator can be approximated as $\ln(1-a) = -a$ for small values of a and/or can be provided in a look-up table for a range of predefined values of a. As can be seen, adapting phase shifting to a background noise level is a computationally "cheap" feature composed of only a simple multiplication and a division, which are available operators in controller units.

Figure 8:
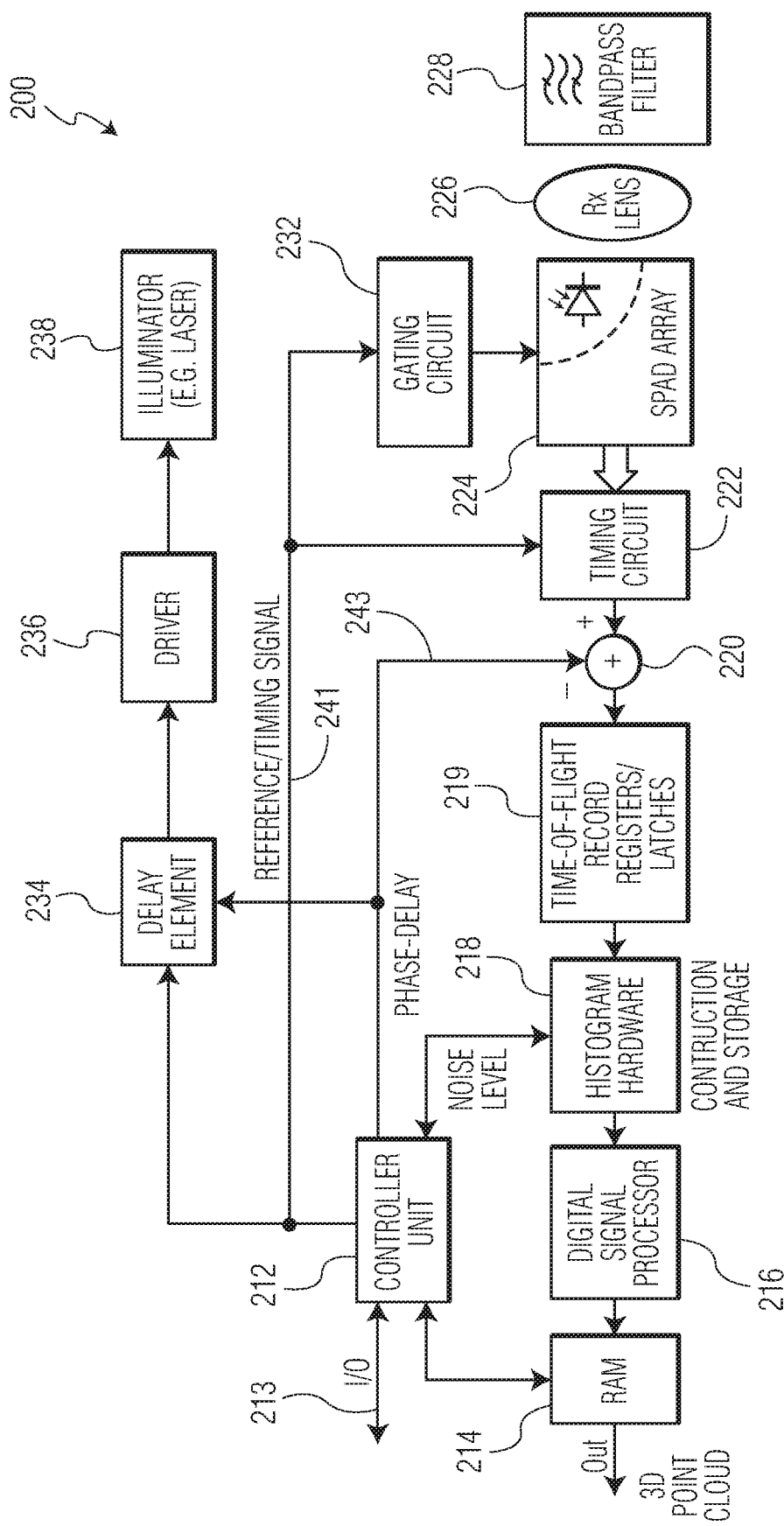
FIG. 8 depicts an example block diagram of an automotive LiDAR system that implements adaptive interleaved range-gating.

FIG. 8 depicts a block diagram of a LiDAR system 200 with implemented adaptive interleaved range-gating. The example LiDAR system 200 shown in FIG. 1 can be implemented as a sensor circuit that includes, for example, a controller unit 212 connected to a gating circuit 232, which in turn can be connected to a receiver element such as the SPAD array 224. The LiDAR system 200 can include a transmitter that can include one or more elements such as a delay element 234, a transmitter driver 236, and a transmitter illuminator 238. The delay element 234, the transmitter driver 236 and the transmitter illuminator 238 can form the "transmitter" of the LiDAR system 200.

The sensor circuit that forms the LiDAR system 200 can include the controller unit 212 (also referred to as a "control unit", "MCU", and similar), which can orchestrate LiDAR system operations such as synchronizing/sending the reference signal to a transmitter, range-gating, and timing circuit operations for correct time-of-flight estimation, along with setting a phase-delay value, and translating the 2D/3D point cloud stored in a RAM (Random Access Memory) 214 into a desired output format. The controller unit 212 can be subject to an I/O (Input/Output) signal 213 (e.g., for controlling the system parameters or checking the system state).

In the sensor circuit of LiDAR system 200, the controller unit 212 transmits a transmit signal to the SPAD array 224 via the gating circuit 232. A signal from the SPAD array 224 is then sent to the timing circuit 222, which then provides a signal to the adder 220 that is then input to the time-of-flight record element (registers or latches), which then provides a signal to histogram hardware 218 that then outputs one or more histograms for processing by the digital signal processor 216, which provides data to RAM 214, that outputs data to a 3D point cloud.

The phase-shift resolution offered by the LiDAR system 10 is flexible and can be adjusted with respect to the background noise level, which can be retrieved from the time-of-flight histogram of histogram hardware 218 as measured by a SPAD array 224, or alternatively an auxiliary ambient light sensor so as to achieve a desired sensitivity uniformity.

The controller unit 212 can provide a phase-delay value 243 to the delay element 234. The delay element 234 in turn can delay the reference/timing signal 241 from the controller unit 212, with the amount given by the phase-delay value 243 to the transmitter driver 236 (e.g. a driver circuit). The output from the transmitter driver 236 can be fed as input to a transmitter illuminator 238 (e.g., a laser).

Note that in FIG. 8, the digitally controlled delay element 234, the transmitter driver 236, and the transmitter illuminator 238 form a transmitter path (also referred to as a transmit path). The transmitter illuminator 238 constitutes an illuminator (e.g., a laser). The sensor circuit of the LiDAR system 200 further includes a lens 226 and a bandpass filter 228, which can be located in the LiDAR system 200 with respect to the SPAD array 224.

Note that in some embodiments, the transmitter path may include a MEMS scanner and a MEMS driver for 2D steering of a laser beam or 1D steering of an array of laser beams or line-laser. In other embodiments, the transmitter or transmitter path may include an optical phase array and drivers for scanning a laser beam.

In yet other embodiments, the transmitter or the transmitter path may include a VCSEL (vertical cavity surface emitting laser) array.

In still other embodiments, the transmitter or transmitter path may include a lens system for spreading the beam into a complete field-of-view (e.g. flash) or for laser beam collimation. It can be thus be appreciated that a number of different configurations can be implemented for the transmitter or transmitter path. The point is that the disclosed transmitter can be configured from a variety of different types of devices and elements.

Upon the event (e.g., a detection of a reflected signal), the timing circuit 222 outputs the time difference between the event and the reference/signal, referred to as measured time-of-flight record. The phase delay value 243 can be subtracted from the measured time-of-flight record via an adder 220 and can be written in a time-of-flight record (e.g., a time-of-flight record register or latch). The records from time-of-flight registers or latches can be read-out and passed to the histogram hardware 218 for subsequent histogram generation and storage.

Figure 12A:
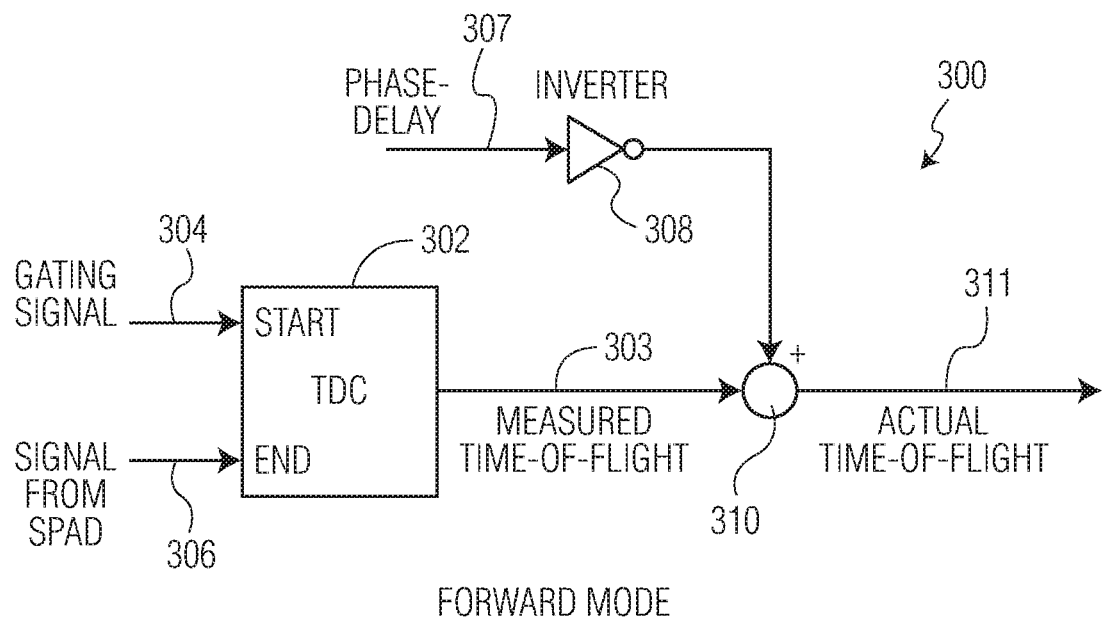
FIG. 12A depicts a schematic diagram of a time-of-flight recovery circuit for a forward mode operated TDC.
Figure 12B:
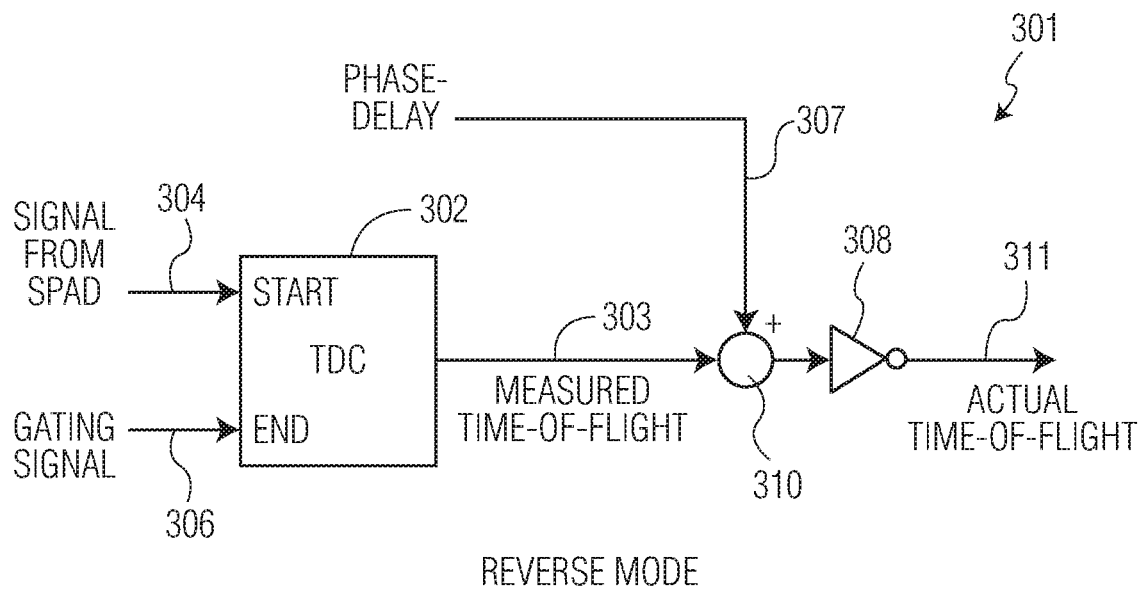
FIG. 12B depicts a schematic diagram of a time-of-flight recovery circuit for a reverse mode operated TDC.

Note that in an alternative embodiment, the timing circuit 222 may be integrated in-pixel, or shared across columns, rows or other sections via means of column/row decoding, multiplexing, etc. The timing circuit 222 can operate in both forward and reverse modes. A forward mode can imply serving of a reference signal as a START signal, and a SPAD detection as an END signal, and vice versa in a reverse mode. Recovery of the actual time-of-flight can be performed by 2's complement using a simple inverter and adder, and can be inexpensive in terms of silicon area. Respective circuit diagrams for forward and reverse mode operated TDC arrays are depicted in FIGS. 12A and 12B.

The histogram hardware 218 can be responsible for time-of-flight histogram generation and storage and can generate and transmit a histogram to a digital signal processor 216. Note that the histogram can be generated in "real time". That is, the time-of-flight records can be read-out and the histogram updated after each measurement cycle. In an alternative embodiment of the LiDAR system 200, the histogram can be generated after all measurement cycles are completed, given a sufficient number of time-of-flight records registers or latches to store all events. In still another embodiment of the LiDAR system 200, the time-of-flight records can be stored in other memory form-factors (e.g., RAM).

The digital signal processor 216 can be responsible for execution of algorithms for signal detection (e.g., CFAR or "Constant False Alarm Rate" detection algorithms) and for writing detected signals to RAM 214. A final point cloud generated from distinct reflections can be retrieved from RAM 214. Processing by the digital signal processor 216 may extend beyond signal detection including but not limited to: subsequent point-cloud filtering, segmentation, object classification, and state estimation (e.g., see the operations discussed previously with respect to blocks 112, 114, 116, and 118 in FIG. 2).

The LiDAR system 200 can include the transmitter illuminator 238, the transmitter driver 236, the delay element 234 (e.g., a digitally controlled delay element), a receiver element such as the SPAD array 224, a gating circuit 232, a timing circuit 222 (e.g., a TDC array), the adder 220, histogram hardware 218 for both construction and storage, the digital signal processor 216 (e.g. for signal detection algorithm), the controller unit 212 and the device RAM 214. Note that the receiver SPAD array 224 can be a receiver element for the LiDAR system 200. As discussed in further detail herein, such a receiver element can be subject to range-gating. That is, the receiver element (e.g., SPAD array 224) can be active for single or multiple sub-regions of a complete operational region relative to the LiDAR system 200.

In the LiDAR system 200 shown in FIG. 8, multiple separate blocks in the diagram may or may not be integrated in a single form-factor. For example, in some embodiments the SPAD array 224, the gating circuit 232 and the timing circuit 222 may be integrated in a single front-end chip. One advantage that the range-gating provided by the LiDAR system 200 offers is that the dynamic range of the timing circuit 222 can be substantially reduced, because only the timing within a single gating window may be performed (i.e. least significant bits of time-of-flight). Note that while the most significant bits of the time-of-flight can be concatenated from the gating window number, the gating window number can be retrieved via a course counter (e.g., course counter 221 shown in FIG. 9) triggered by the rising and falling edge of a gating signal, as depicted in the alternative embodiment shown in FIG. 9.

Figure 9:
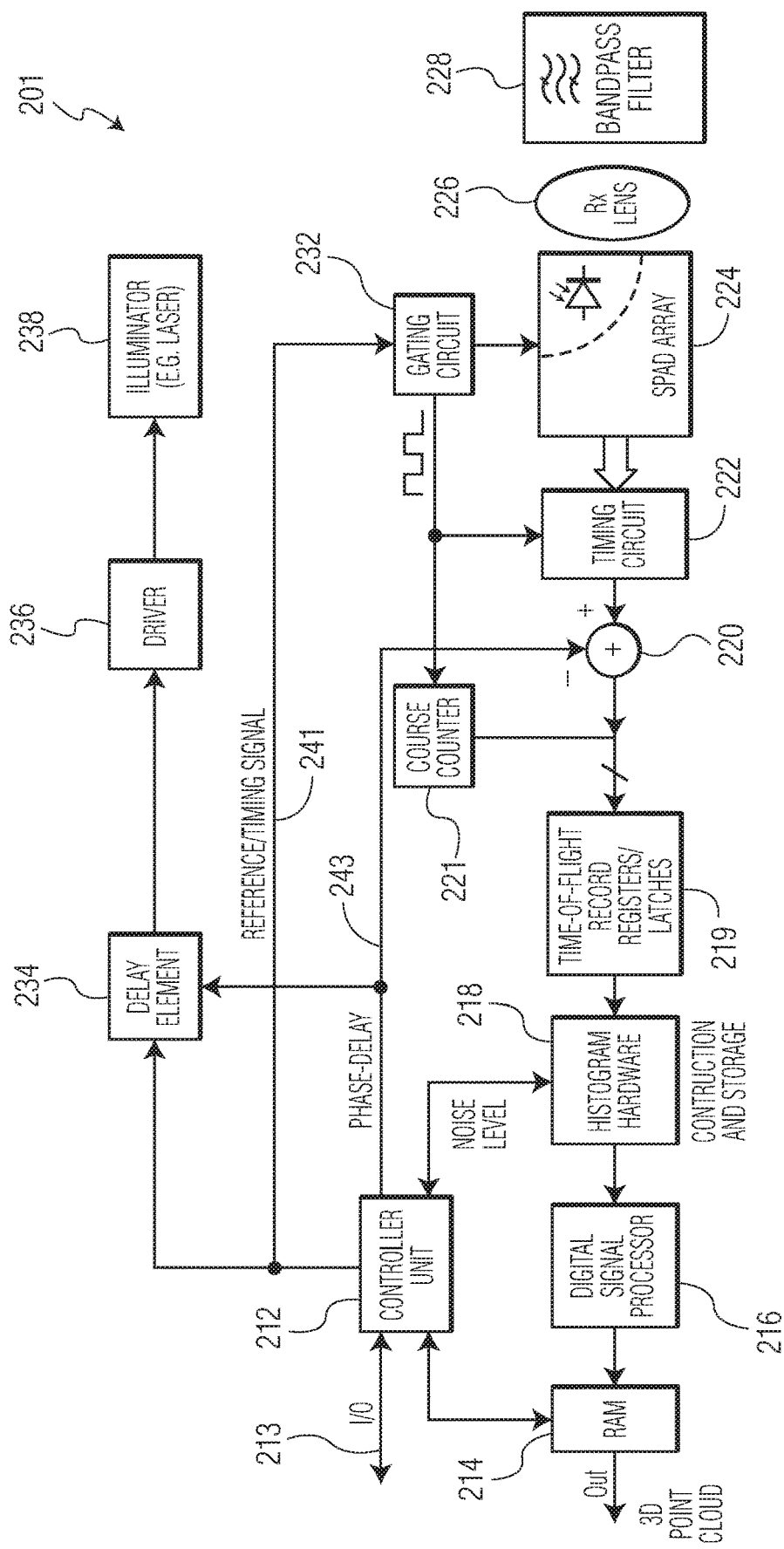
FIG. 9 depicts an example block diagram of an automotive LiDAR system that implements adaptive interleaved range-gating with a timing circuit that operates with a reduced dynamic range.

FIG. 9 depicts an example block diagram of a LiDAR system 201 implementing adaptive interleaved range-gating with a timing circuit 222 of reduced dynamic range. The LiDAR system 201 shown in FIG. 9 is an alternative version of LiDAR system 200 shown in FIG. 8. Note that in FIGS. 8, 9, and 10, identical or similar components or elements are generally indicated by identical reference numerals. The LiDAR system 201 shown in FIG. 9 can be implemented as a sensor circuit that incorporates an additional element not included in the LiDAR system 200 shown in FIG. 8. For example, the LiDAR system 201 can include a coarse counter 221 that receives input from the gating circuit 232. The course counter 221 can then output a signal that is fed to the time-of-flight record 219.

The disclosed LiDAR systems can be based on histogram-less signal identification. For example, the time-of-flight records can be read-out directly into a digital signal processor or a hardware accelerator for processing. It is not essential that time-of-flight records resulting from the disclosed approach be used to generate histogram. Any algorithms based on a statistical approach, including those without constructing histogram can benefit from adaptive-interleaved range-gating. An example for such a system is depicted in FIG. 10.

Figure 10:
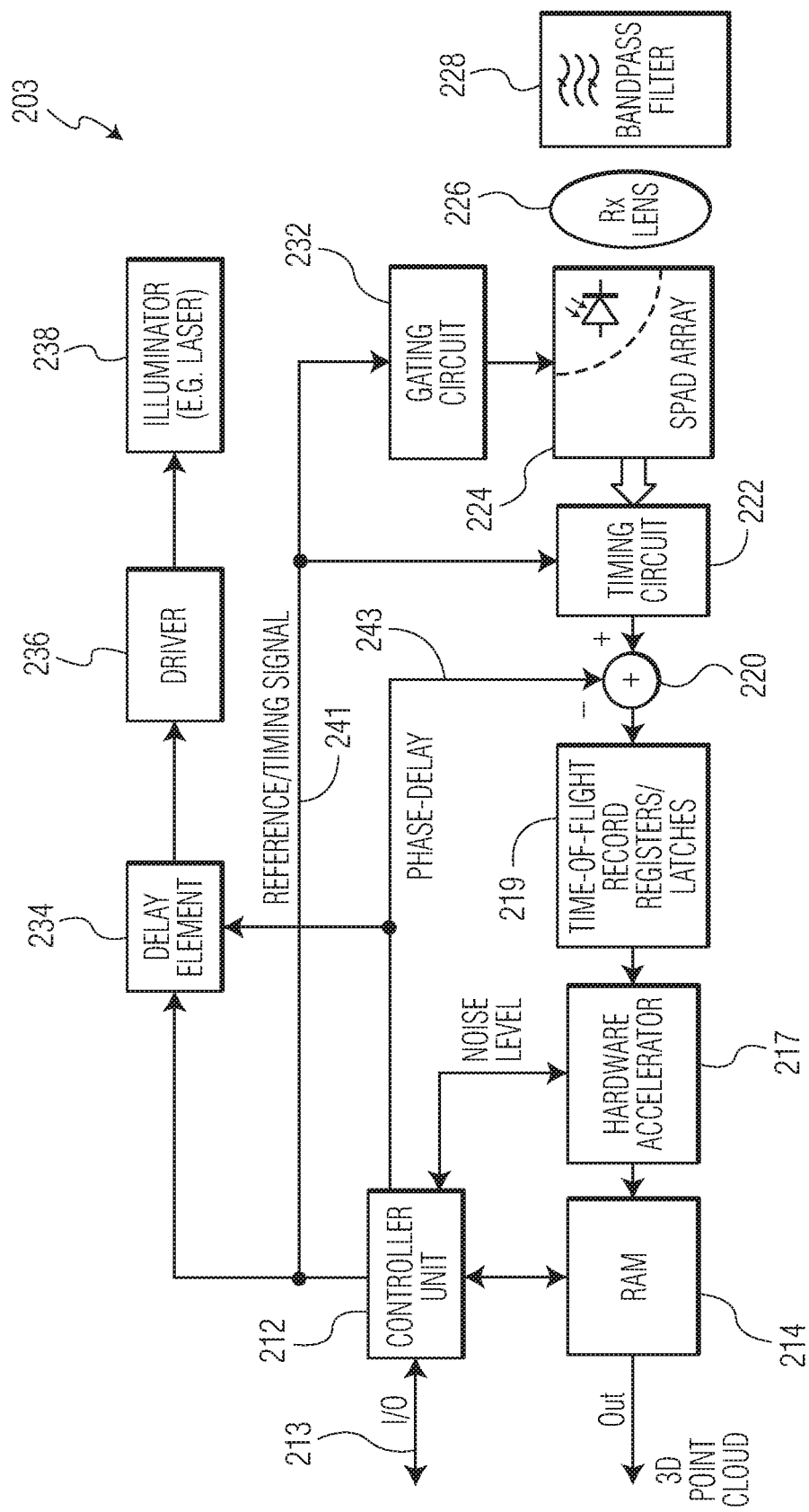
FIG. 10 depicts a block diagram of an automotive LiDAR system that implements adaptive interleaved range-gating including hardware for histogramless signal detection.

FIG. 10 depicts an example block diagram of a LiDAR system 203 that can implement adaptive interleaved range-gating with a hardware accelerator 217 for histogram-less signal detection. As shown in FIG. 10, the LiDAR system 203 can be implemented as a sensor circuit that includes a hardware accelerator 217 that receives a signal output from the time-of-flight record 219 and then outputs a signal indicative of noise level to the controller unit 212 and additionally can provide a signal as input to RAM 214.

Figure 11:
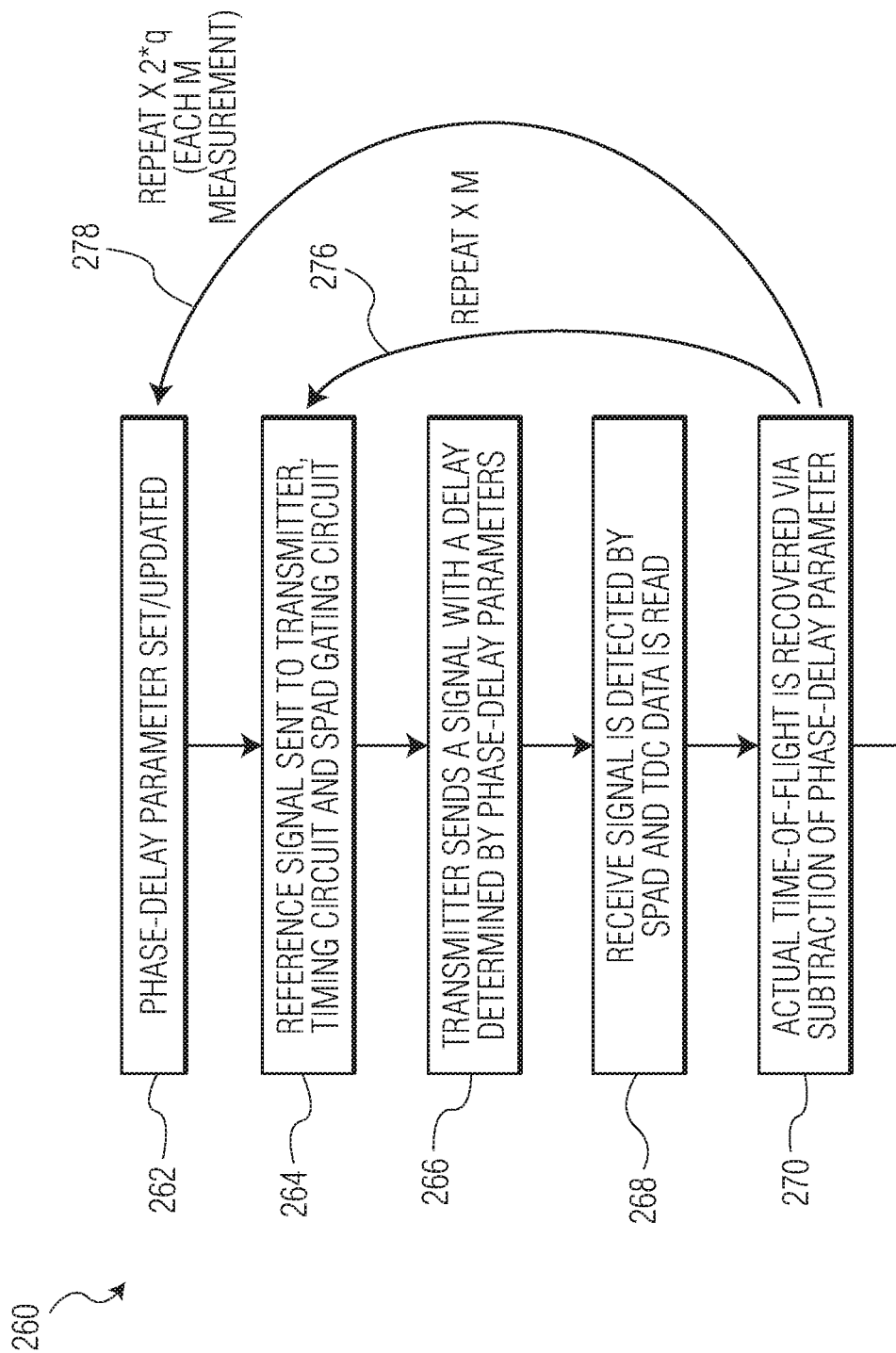
FIG. 11 depicts a signal flow diagram illustrating a method of adaptive interleaved range-gating for operating a LiDAR system.

FIG. 11 depicts a signal flow diagram illustrating a method 260 of adaptive interleaved range-gating for operating a LiDAR system such as the LiDAR systems 200, 201 or 203 respectively depicted in FIGS. 8, 9, and 10. Note that the various steps or operations depicted in the various blocks in FIG. 11 can be implemented in the context of a single pixel. As shown at block 262, a step or operation can be implemented in which the controller unit 212 updates/sets a phase-delay parameters. Thereafter, as depicted at block 264, a step or operation can be implemented in which the controller unit 212 transmits a reference signal to the transmitter, the timing circuit 222, and the SPAD gating circuit 232. Then, as shown at block 266, a step or operation can be implemented in which the transmitter sends a signal with a delay determined by the phase-delay parameters.

Next, as indicated at block 268, a step or operation can be implemented in which the received signal may be detected by the SPAD array 224 and TDC data can be read. Thereafter, as shown at block 270, a step or operation can be implemented in which the actual time-of-flight can be recovered via subtraction of the phase-delayed parameter (i.e., via a subtraction operation provided by the adder 222).

Following implementation of the operation shown at block 270, the steps or operations shown at blocks 264, 266, 628, and 270 can be repeated m times, as indicated by arrow 276. Alternatively, as indicated by arrow 278, the operations beginning with the step or operation depicted at block 262 and so on, can be repeated by 2*q (each m measurement).

The method 260 shown in FIG. 11 can be based on the fact that the controller unit 212 can be responsible for synchronizing and orchestrating the complete system. The controller unit 212 in some embodiments may include an internal clock while in other embodiments can utilize an external clock. Among other features, the controller unit 212 can send a reference signal or a timing signal to the gating circuit 232 and to the timing circuit 222 and synchronize time origins for a correct time-of-flight estimation. The controller unit 212 can also be responsible for controlling a variable phase-delay and passing it to the delay element 234 as a parameter and to the adder 220 to subtract it from the output of the timing circuit 222.

The delay element 234 can be responsible for controlled phase delaying of a transmit signal via the delay of a reference or timing signal from the controller unit 212 to the transmitter driver 236. By subtracting the delay from the TDC output, an equivalent effect of phase-shifting gating waveforms can be achieved.

The gating circuit 232 can facilitate interleaving of the range-gating waveform via a subsequent subtraction of a phase-delay parameter for the recovery of the actual time-of-flight, or via phase-delay parameter comprising a pseudo-random phase delay with a subsequent subtraction of a phase-delay parameter for the recovery of the actual time-of-flight. The gating circuit 232 can also facilitate interleaving of the range-gating waveform via a phase-delay parameter comprising a random phase delay with a subsequent subtraction of a phase-delay parameter for the recovery of the actual time-of-flight recovery.

FIG. 12A depicts a schematic diagram of a time-of-flight recovery circuit 300 for a forward mode operated TDC. FIG. 12B depicts a schematic diagram of a time-of-flight recovery circuit 300 for a reverse mode operated TDC. Note that in both the circuit 300 shown in FIG. 12A and the circuit 301 shown in FIG. 12B, identical or similar parts or elements can be indicated by identical reference numerals. In some embodiments, the TDC array 302 shown in FIG. 12A and FIG. 12B may implement the timing circuit 222 discussed previously with respect to FIG. 8, FIG. 9 and FIG. 10.

As shown in FIG. 12A, the TDC array 302 can receive a reference signal 304 (i.e., a gating signal) at a "start" pin and a signal 306 from a SPAD (e.g., such as the previously discussed SPAD array 224) at an "end" pin. A measured signal that is indicative of a time-of-flight 303 can be output from the TDC array 302 and input to the adder 310. An inverter 308 can receive a phase-delay signal 307 as input and can then output a signal to the adder 310. The signals output by the TDC array 302 and the inverter 308 can be input to the adder 310, which in turn can output a signal that is indicative of the actual time-of-flight.

The time-of-flight recovery circuit 301 shown in FIG. 12B for a reverse mode operated TDC can include the inverter 308 located after the adder 307. That is, in the configuration of FIG. 12A, the output from the inverter 398 can be input to the adder 310 along with the measured time-of-flight 303. In the configuration of FIG. 12B, the output from the adder 310 can be input to the inverter 308, which can then outputs a signal indicative of the actual time-of-flight 311.

A difference between the configurations depicted in FIGS. 12A and 12B is that the phase-delay signal 307 can be input directly to the adder 310 and the inverter 208 can be located after the adder 310. That is, the inverter 308 can receive as input, the output from the adder 310, and then generate an output signal indicative of the actual time-of-flight 311.

The techniques described herein can be applied to various types of LiDAR systems such as automotive LiDAR systems. In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), a digital video disk (DVD), Flash memory, and so on.

Alternatively, embodiments of the invention may be implemented entirely in hardware or in an implementation containing both hardware and software elements. In embodiments that do utilize software, the software may include but is not limited to firmware, resident software, microcode, etc.

In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A LiDAR (Light Detection and Ranging) system, comprising:
   a sensor circuit comprising a controller unit, a transmitter, a gating circuit, and a receiver element, wherein the gating circuit is connected to the controller unit and to the receiver element, wherein signals detected by the sensor circuit correspond to at least one physical object located in an operating region with respect to a location of the sensor circuit and based on multiple measurements;
   wherein the gating circuit range-gates the receiver element based on a range-gating waveform; and
   wherein the controller unit provides a phase-delay parameter for phase shifting the range-gating waveform with different phase values relative to a light signal transmitted by the transmitter for different measurements by the sensor circuit.

2. The LiDAR system of claim 1 wherein the phase shifting of the range-gating waveform is effectuated by transmitting from the transmitter the light signal with a time delay of a reference signal-to-transmitter path that is equivalent to a desired phase shift and a recovery of an actual time-of-flight by subtracting the time delay from a time-of-flight record as measured by a timing circuit of the sensor circuit.

3. The LiDAR system of claim 2 wherein the timing circuit comprises a time-to-digital converter array.

4. The LiDAR system of claim 2 wherein the gating circuit facilitates interleaving of the range-gating waveform via a subsequent subtraction of a phase-delay parameter for the recovery of the actual time-of-flight.

5. The LiDAR system of claim 2 wherein the gating circuit facilitates interleaving of the range-gating waveform via a phase-delay parameter comprising a pseudo-random phase delay with a subsequent subtraction of a phase-delay parameter for the recovery of the actual time-of-flight.

6. The LiDAR system of claim 2 wherein the gating circuit facilitates interleaving of the range-gating waveform via a phase-delay parameter comprising a random phase delay with a subsequent subtraction of a phase-delay parameter for the recovery of the actual time-of-flight recovery.

7. The LiDAR system of claim 1 wherein:
   a level of the background noise is measured by the sensor circuit, and
   a phase-shift resolution is adapted for the phase shifting, wherein the phase-shift resolution comprises a minimum difference between two different phase-shift values, with respect to the level of the background noise level.

8. The LiDAR system of claim 1 wherein the receiver element comprises a SPAD (Single-Photon Avalanche Photodiode) array.

9. A LiDAR (Light Detection and Ranging) system, comprising:
   a sensor circuit comprising a controller unit, a transmitter, a gating circuit, a timing circuit and a receiver element, wherein the gating circuit is connected to the controller unit and to the receiver element and the receiver element is connected to the timing circuit, wherein signals detected by the sensor circuit correspond to at least one physical object located in an operating region with respect to a location of the sensor circuit and based on multiple measurements;
   wherein the gating circuit range-gates the receiver element based on a range-gating waveform; and
   wherein the controller unit provides a phase-delay parameter for phase shifting the range-gating waveform with different phase values relative to a light signal transmitted by the transmitter for different measurements by the sensor circuit.

10. The LiDAR system of claim 9 wherein the timing circuit comprises a time-to-digital converter array and the receiver element comprises a SPAD (Single-Photon Avalanche Photodiode) array.

11. The LiDAR system of claim 9 the phase shifting of the range-gating waveform is effectuated by transmitting from the transmitter the light signal with a time delay of a reference signal-to-transmitter path that is equivalent to a desired phase shift and a recovery of an actual time-of-flight by subtracting the time delay from a time-of-flight record as measured by the timing circuit.

12. The LiDAR system of claim 11 wherein the gating circuit facilitates interleaving of the range-gating waveform via a phase-delay parameter comprising a random phase delay with a subsequent subtraction of a phase-delay parameter for the recovery of the actual time-of-flight recovery.

13. A method of operating a LiDAR (Light Detection and Ranging) system, comprising:

identifying, based on multiple measures, detected signals corresponding to at least one physical object located in an operating region with respect to a location of a LiDAR system that includes a receiver element;

range-gating the receiver element of the LiDAR system based on a range-gating waveform; and phase shifting the range-gating waveform with different phase values relative to a light signal transmitted by the LiDAR system for different measurements by the LiDAR system.

14. The method of claim 13 further comprising effectuating the phase shifting of the range-gating waveform by transmitting from the LiDAR system the light signal with a time delay of a reference signal-to-transmitter path that is equivalent to a desired phase shift and a recovery of a time-of-flight by subtracting the time delay from a time-of-flight record as measured by a timing circuit of the LiDAR system.

15. The method of claim 14 wherein the timing circuit comprises a time-to-digital converter array.

16. The method of claim 14 further comprising facilitating interleaving of the range-gating waveform via a subsequent subtraction of a phase-delay parameter for the recovery of the time-of-flight.

17. The method of claim 14 further comprising facilitating interleaving of the range-gating via a phase-delay parameter comprising a pseudo-random phase delay with a subsequent subtraction of a phase-delay parameter for the recovery of the time-of-flight.

18. The method of claim 14 further comprising facilitating interleaving of the range-gating waveform via a phase-delay parameter comprising a random phase delay with a subsequent subtraction of a phase-delay parameter for the recovery of the time-of-flight.

19. The method of claim 13 further comprising:

measuring a level of the background noise; and adapting a phase-shift resolution for the phase shifting, wherein the phase-shift resolution comprises a minimum difference between two different phase-shift values, with respect to the level of the background noise level.

20. The method of claim 13 wherein the receiver element comprises a SPAR array.

* * * * *